(12) United States Patent
Lifka et al.

(10) Patent No.: US 11,749,766 B2
(45) Date of Patent: Sep. 5, 2023

(54) PHOTOVOLTAIC DEVICE AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Herbert Lifka, Eindhoven (NL); Francesco Di Giacomo, Rome (NL); Henri Fledderus, Eindhoven (NL); Yulia Galagan, Taipei (TW); Valerio Zardetto, Eindhoven (NL); Siegfried Christiaan Veenstra, Eindhoven (NL); Mehrdad Najafi, Veldhoven (NL); Dong Zhang, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 72 days.

(21) Appl. No.: 17/261,985

(22) PCT Filed: Jul. 23, 2019

(86) PCT No.: PCT/NL2019/050470
§ 371 (c)(1),
(2) Date: Jan. 21, 2021

(87) PCT Pub. No.: WO2020/022883
PCT Pub. Date: Jan. 30, 2020

(65) Prior Publication Data
US 2021/0265517 A1 Aug. 26, 2021

(30) Foreign Application Priority Data
Jul. 25, 2018 (EP) .................................. 18185478

(51) Int. Cl.
*H01L 31/05* (2014.01)
*H01L 31/0224* (2006.01)
*H01L 31/18* (2006.01)

(52) U.S. Cl.
CPC .. *H01L 31/0508* (2013.01); *H01L 31/022425* (2013.01); *H01L 31/18* (2013.01)

(58) Field of Classification Search
CPC ......... H01L 31/0508; H01L 31/022425; H01L 31/18
See application file for complete search history.

(56) References Cited

U.S. PATENT DOCUMENTS

2012/0204931 A1  8/2012  Seike
2012/0211083 A1  8/2012  Seike et al.

FOREIGN PATENT DOCUMENTS

| DE | 102012024754 A1 | 6/2014 | |
| WO | WO-2012065048 A1 * | 5/2012 | ....... H01L 31/03529 |
| WO | WO 2017/189232 A1 | 11/2017 | |

OTHER PUBLICATIONS

European Patent Office, International Search Report in corresponding International Application No. PCT/NL2019/050470, dated Nov. 14, 2019 (2 pages).

* cited by examiner

*Primary Examiner* — Tae-Sik Kang
(74) *Attorney, Agent, or Firm* — Leydig, Voit & Mayer, Ltd.

(57) ABSTRACT

A photovoltaic device (1) is provided with a first electrode layer (11), a photovoltaic layer (13), a second charge carrier transport layer (14) and a second electrode layer (15). The photovoltaic device (1) has a plurality of mutually subsequent photovoltaic device cells (1A, . . . , 1F) arranged in a first direction (D1). Each pair of a photovoltaic cell (1C) and its successor are serially connected in an interface region (Continued)

(1CD). The interface region comprises an elongate region (R0) between successive first electrode layer portion (11C, 11D), a first elongate region (R1) between successive photovoltaic layer portions (13A, 13B), a second elongate region (R2) between successive second charge carrier transport layer portions (14C, 14D) and a third elongate region (R3) between successive second electrode layer (15) portions (15C, 15D). The second elongate region (R2) extends within the first elongate region (R1), and its lateral boundaries are distinct from those of the first elongate region (R1).

8 Claims, 9 Drawing Sheets

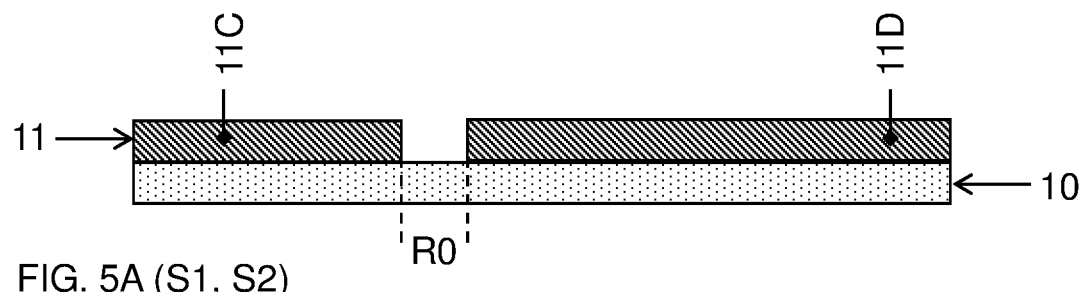
FIG. 5A (S1, S2)
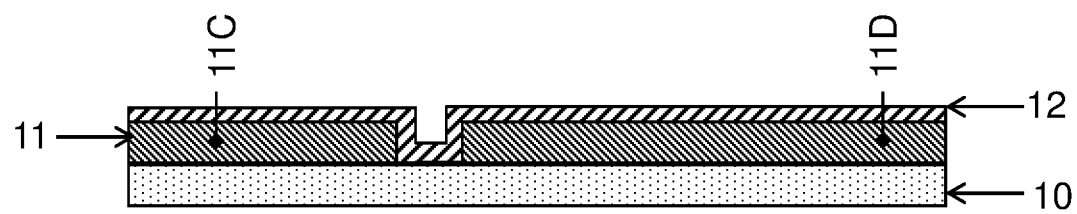
FIG. 5B (S3)
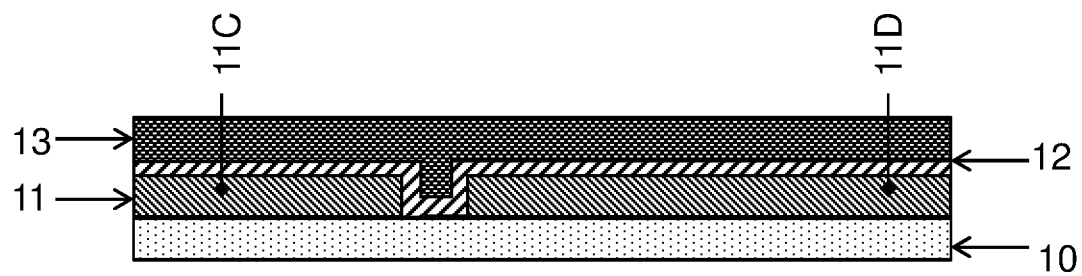
FIG. 5C (S4)
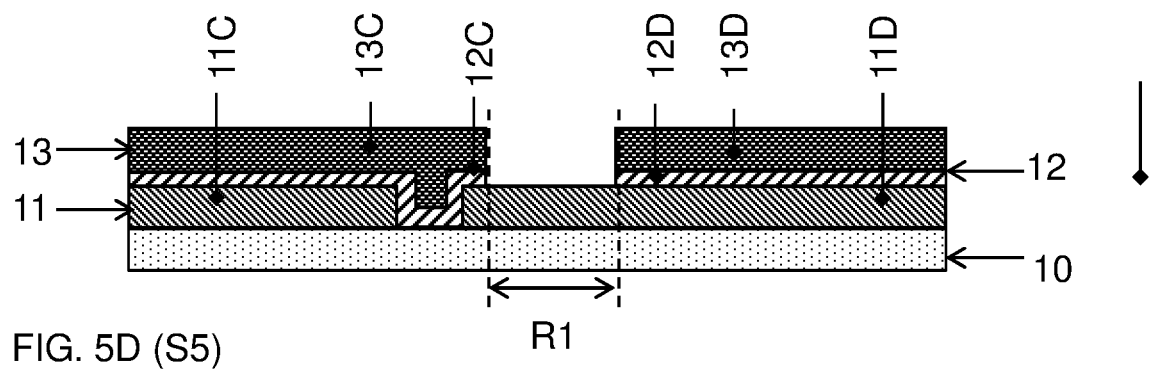
FIG. 5D (S5)

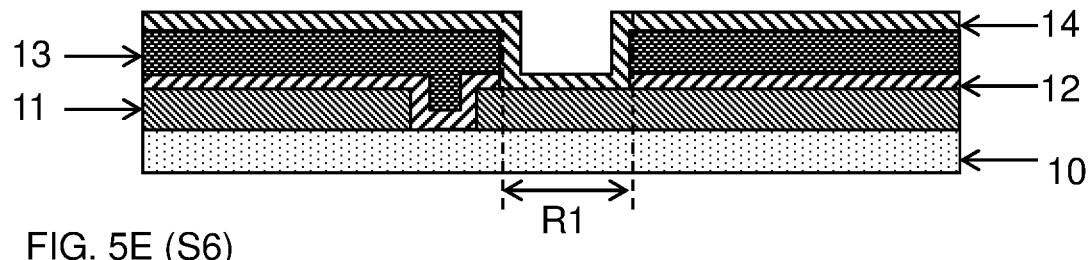
FIG. 5E (S6)
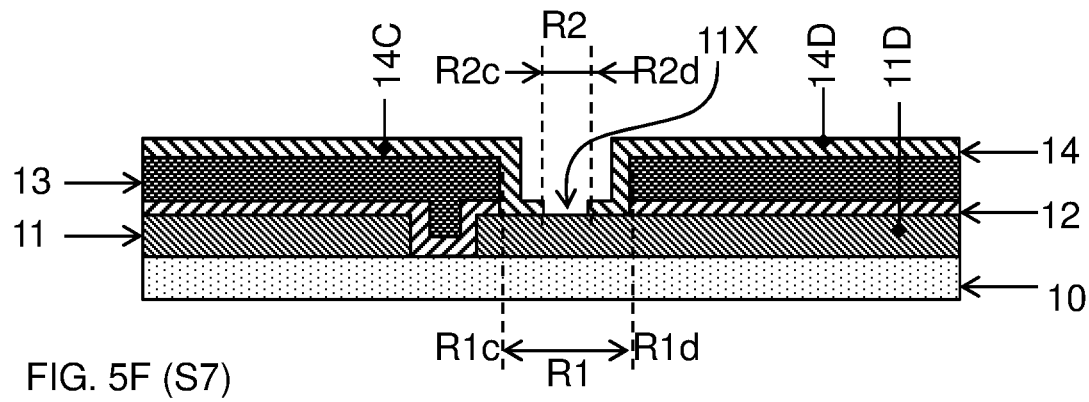
FIG. 5F (S7)
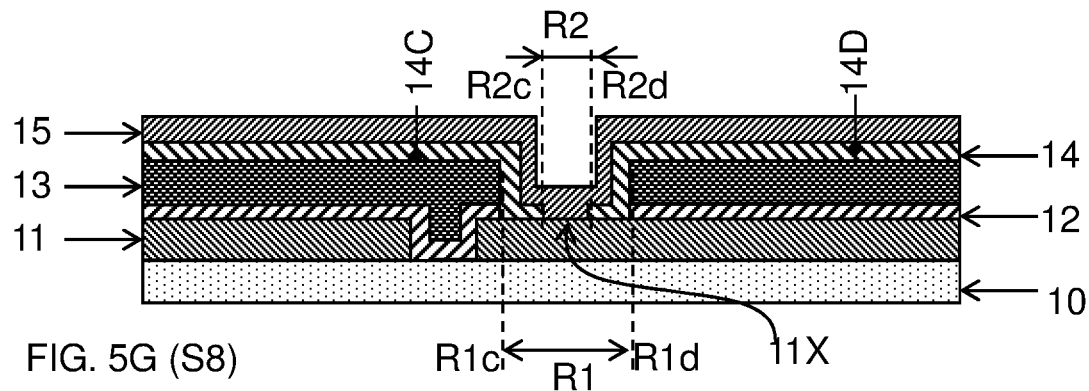
FIG. 5G (S8)
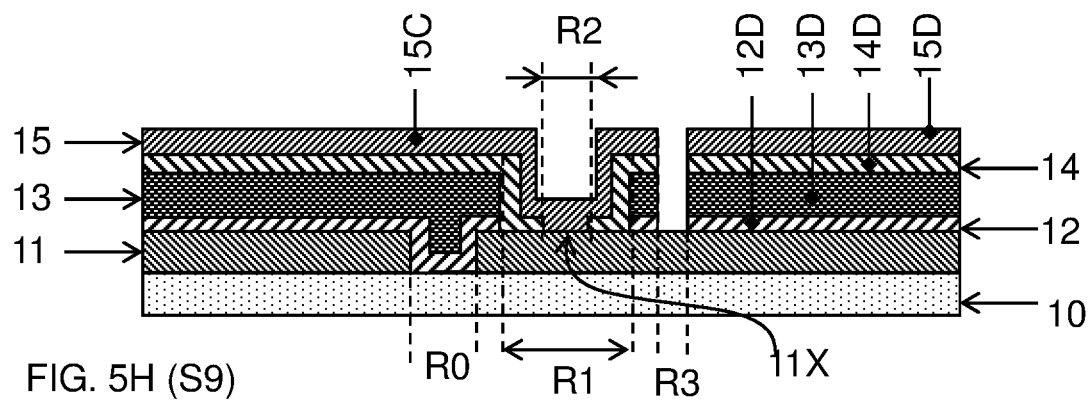
FIG. 5H (S9)

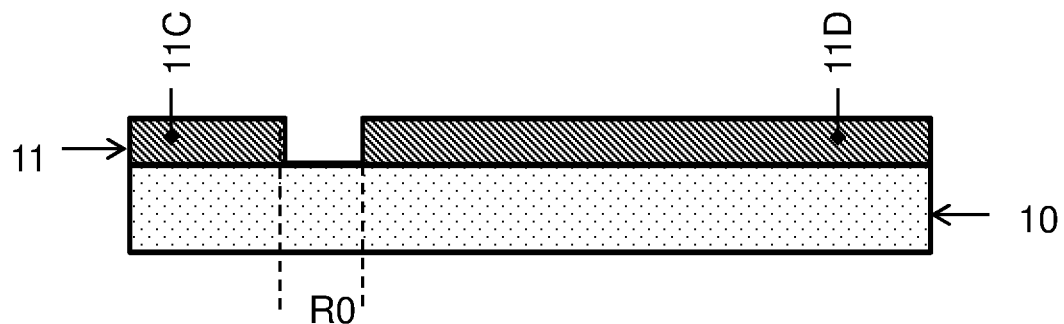
FIG. 6A (S11, S12)
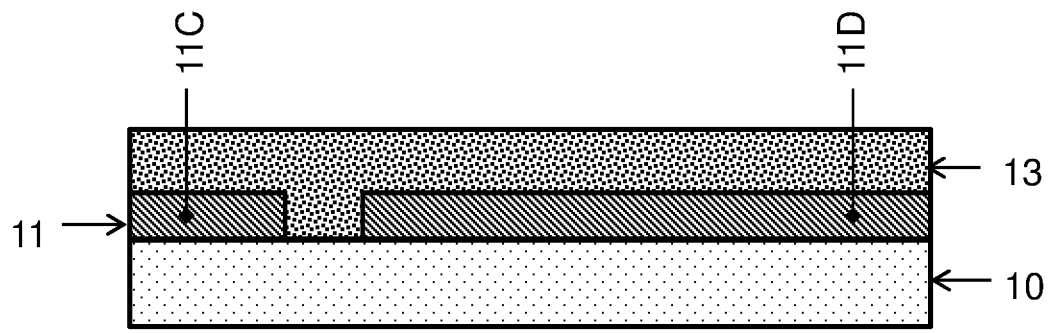
FIG. 6B (S13)
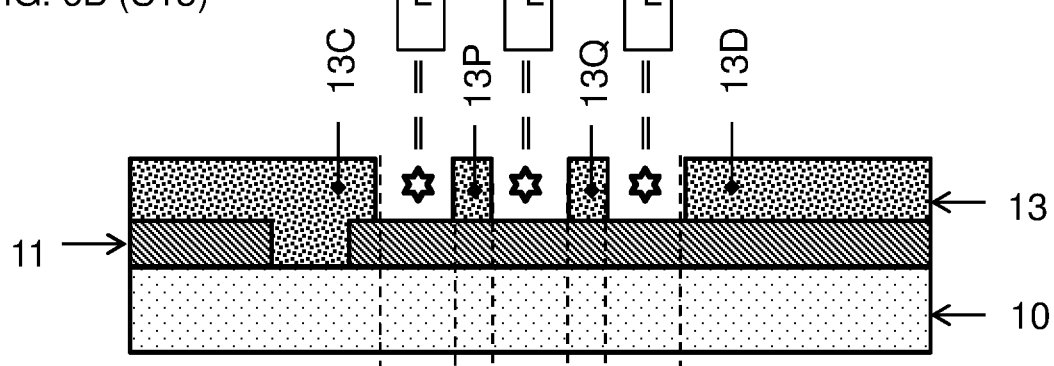
FIG. 6C (S14)
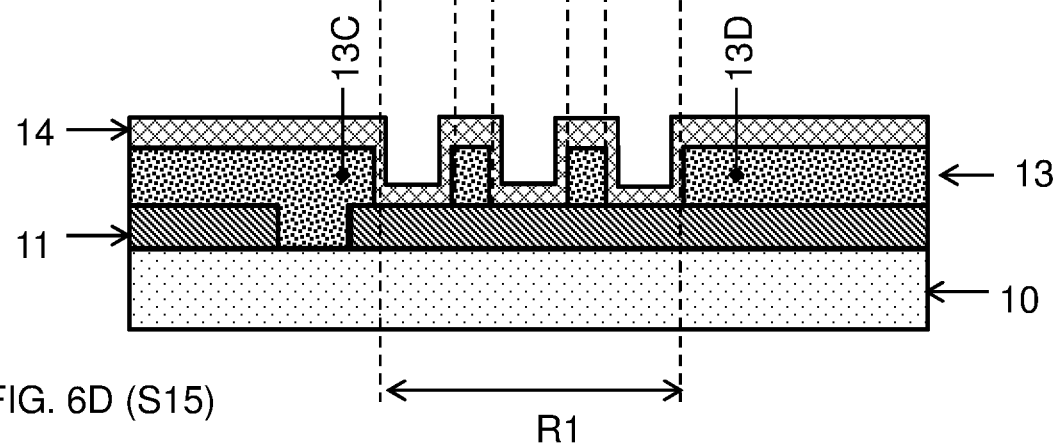
FIG. 6D (S15)

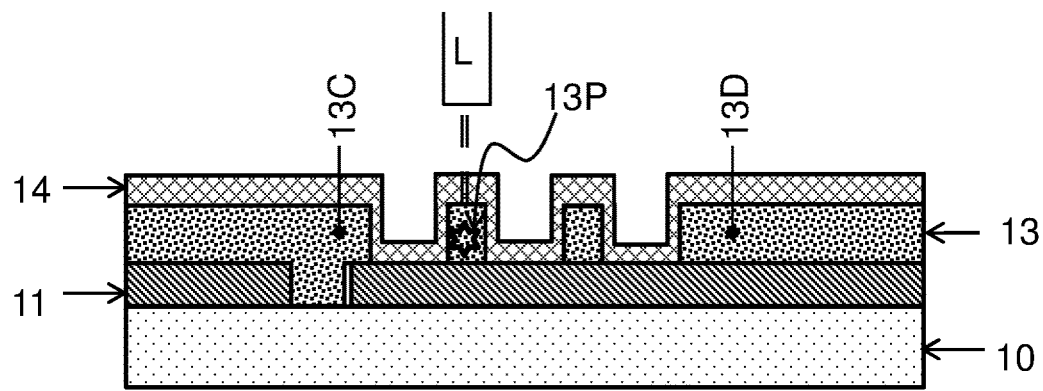
FIG. 6E (S16)
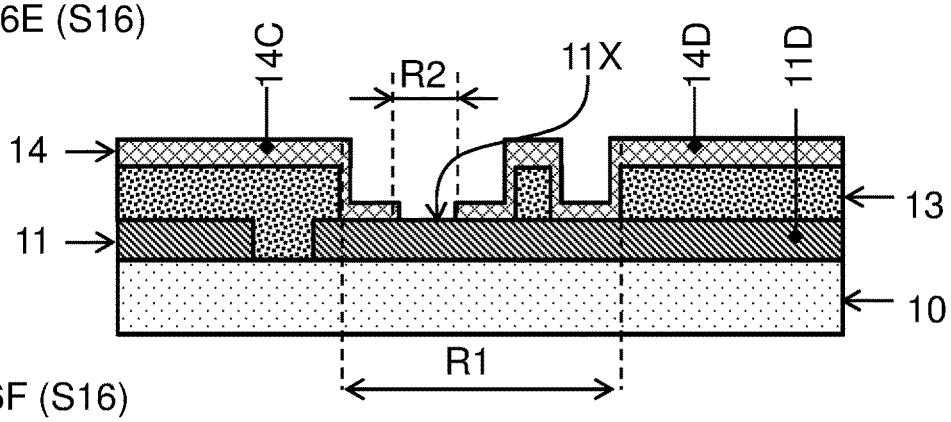
FIG. 6F (S16)
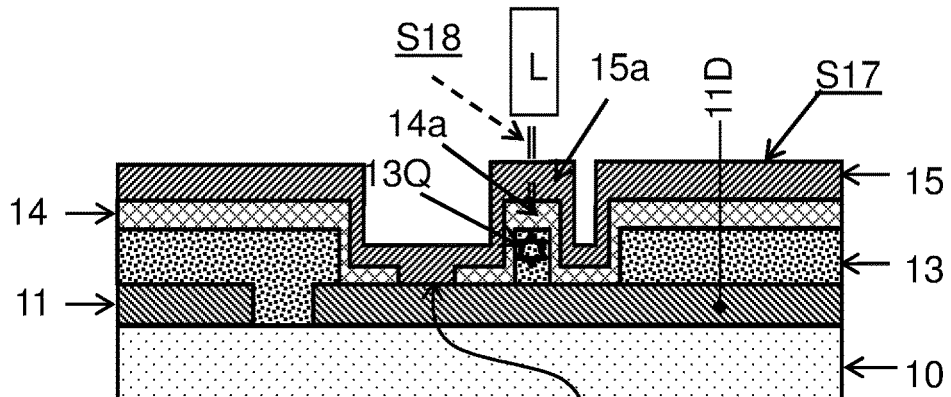
FIG. 6G (S17, S18)
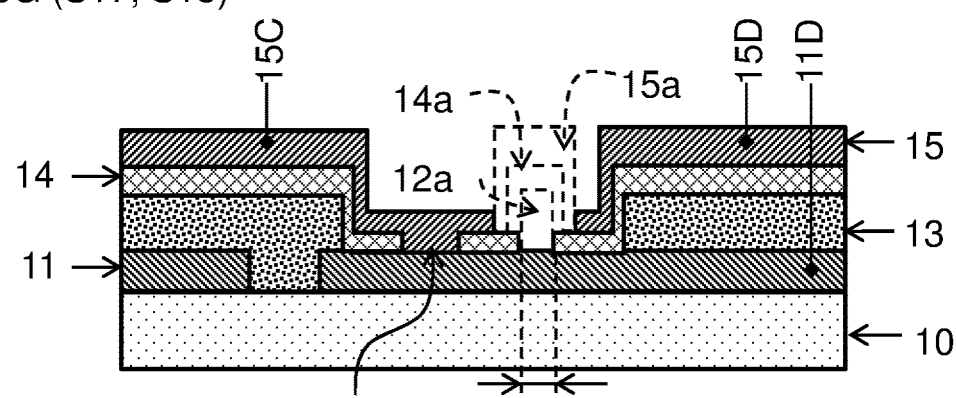
FIG. 6H (S18)

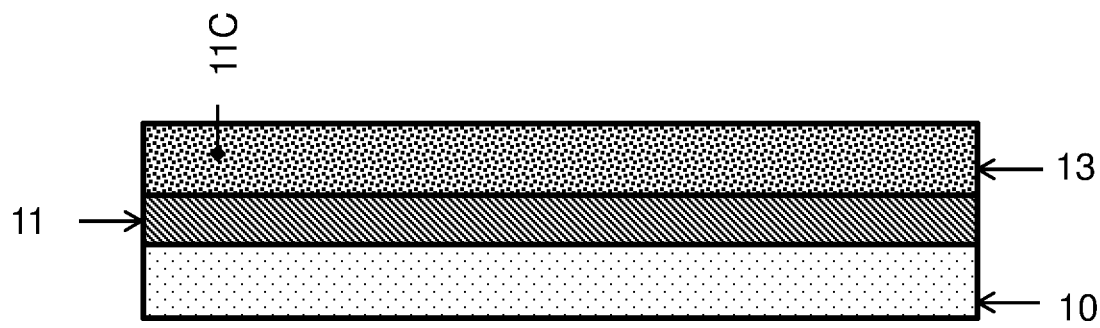
FIG. 7A (S21, S22)
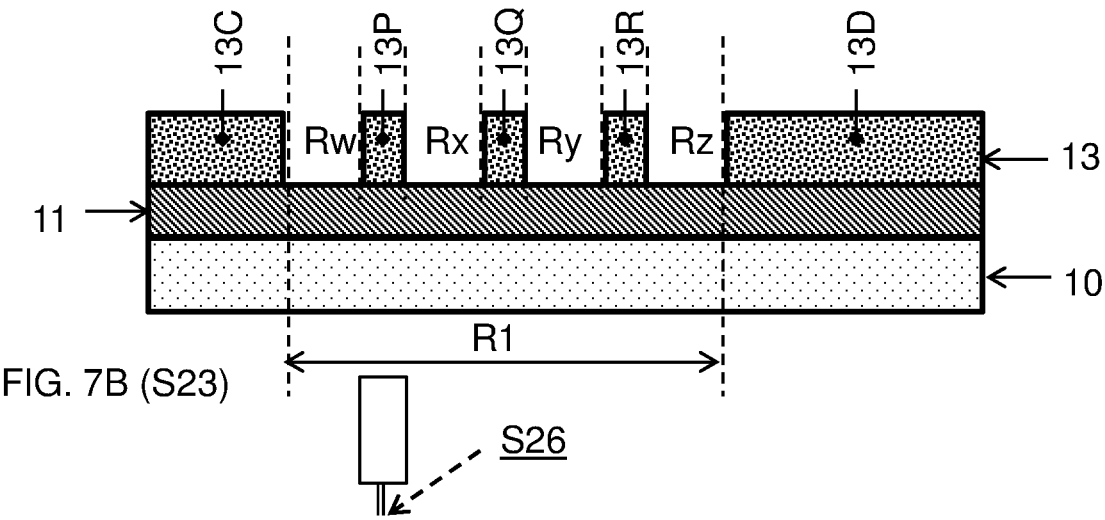
FIG. 7B (S23)
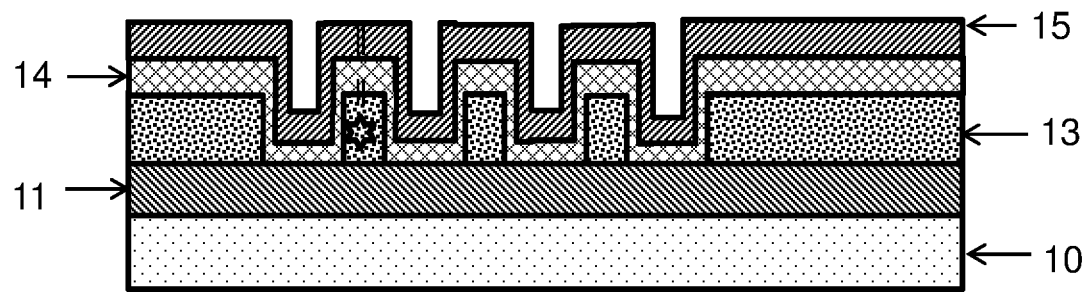
FIG. 7C (S24, S25, S26)
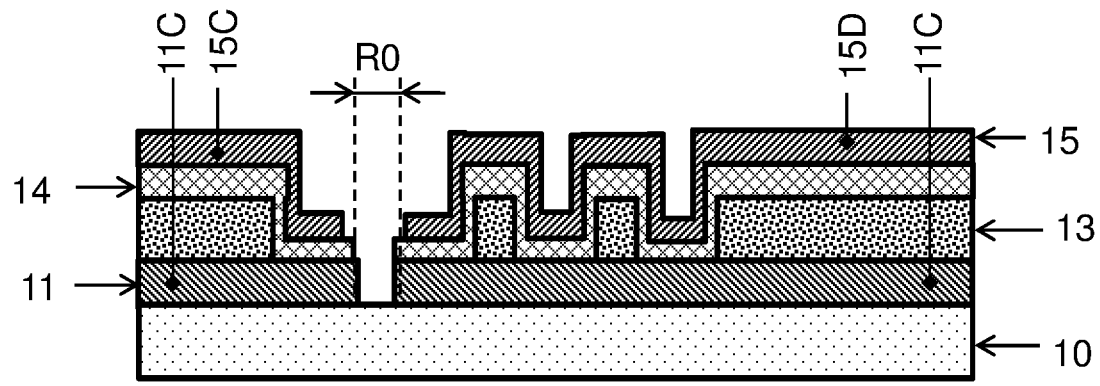
FIG. 7D (S26)

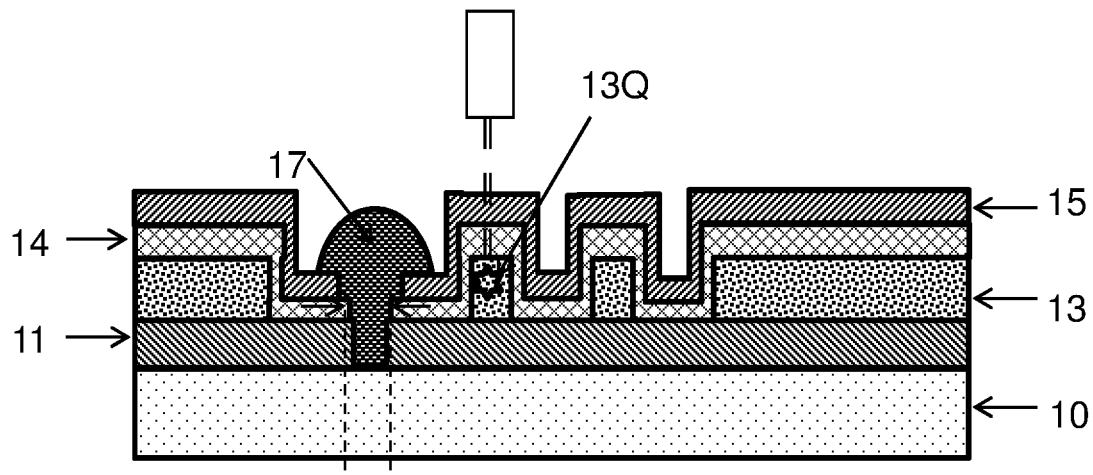
FIG. 7E (S27, S28)
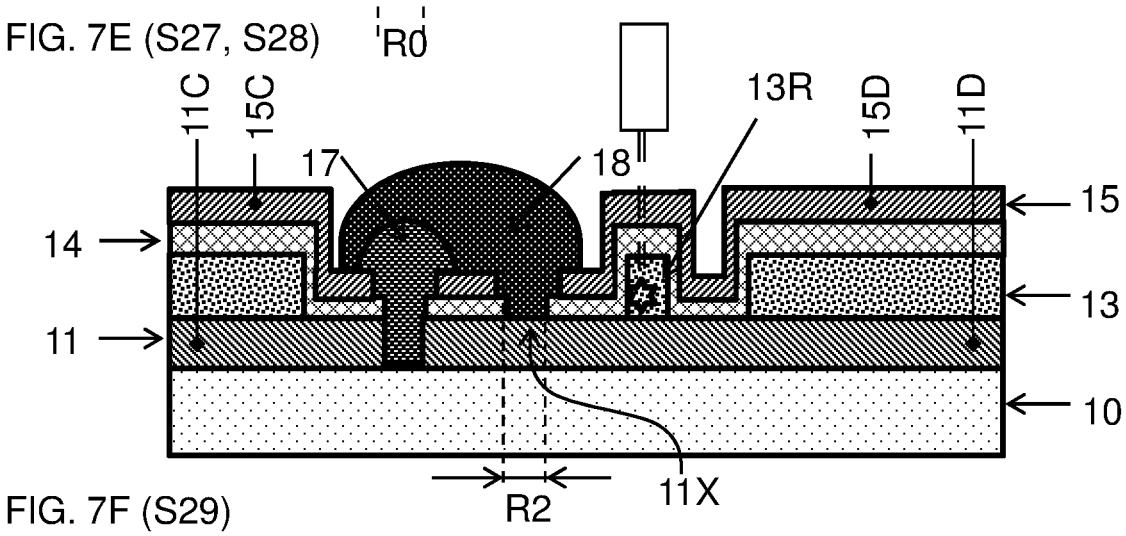
FIG. 7F (S29)
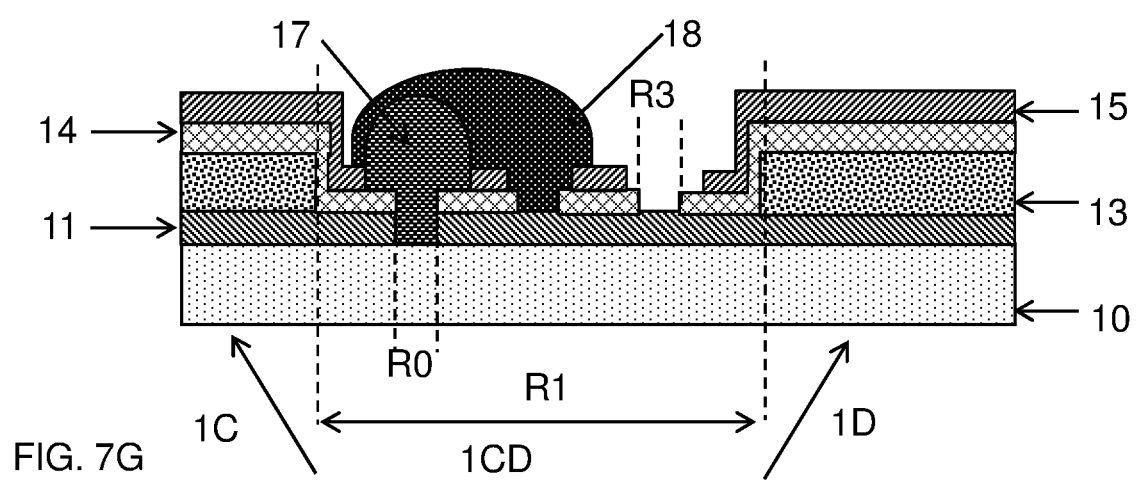
FIG. 7G

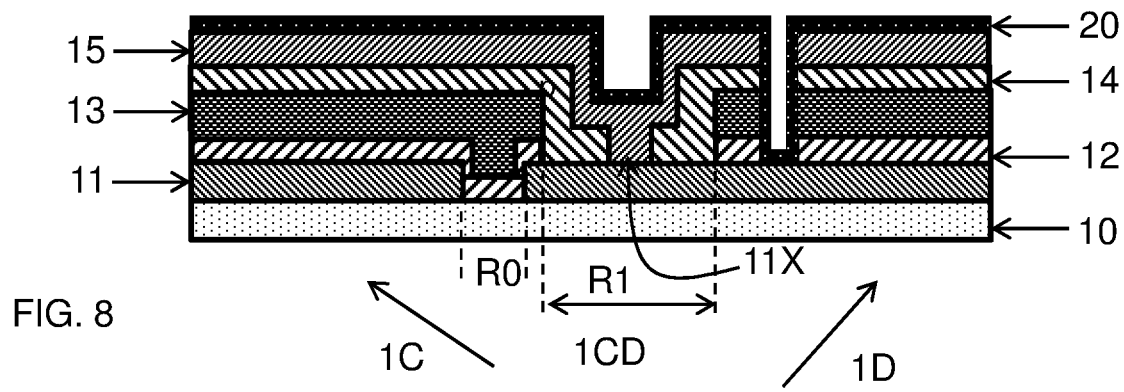
FIG. 8
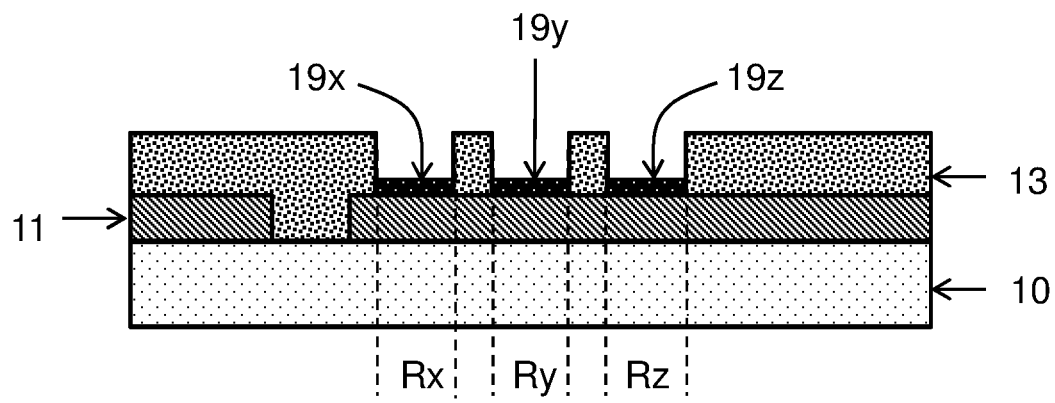
FIG. 9A (S1415)
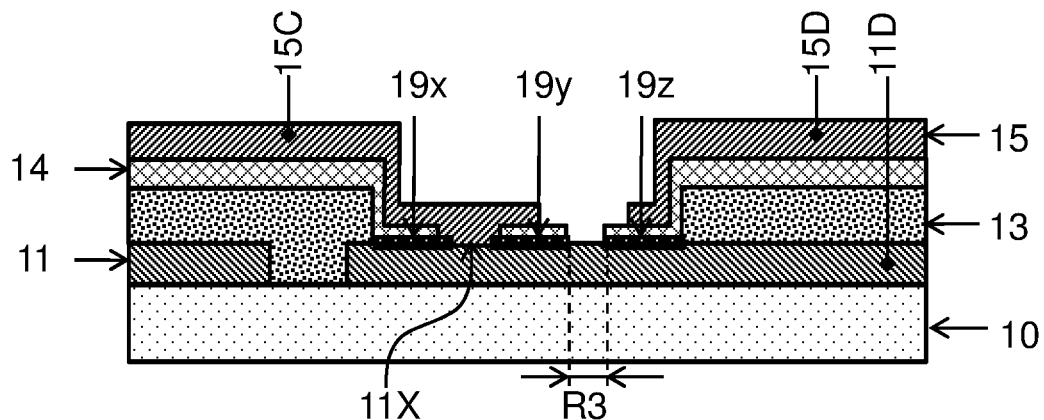
FIG. 9B

PHOTOVOLTAIC DEVICE AND METHOD OF MANUFACTURING THE SAME

CROSS-REFERENCE TO RELATED APPLICATIONS

This patent application is a U.S. National Phase of PCT International Application No. PCT/NL2019/050470, filed Jul. 23, 2019, which claims priority to European Application No. 18185478.7, filed Jul. 25, 2018, which are both expressly incorporated by reference in their entireties, including any references contained therein.

BACKGROUND OF THE INVENTION

Field of the Invention

The present invention relates to a photovoltaic device.
The present invention further relates to a method of manufacturing a photovoltaic device.

Related Art

Photovoltaic devices are typically provided as panels having a plurality of serially arranged photovoltaic device cells. Perovskites are promising materials for use in photovoltaic devices as they allow efficient manufacturing methods at low temperatures and have the potential of a high photovoltaic conversion efficiency, comparable to that of silicon based products. A disadvantage of these materials is however that they easily react with the most common (top) electrode materials. This entails the risk of a deterioration of the photovoltaic product. This applies in particular to photovoltaic device with a plurality of photovoltaic device cells, as the necessary discontinuities of the device layers increases the potential contact areas between the perovskite and electrode material.

SUMMARY OF THE INVENTION

It is a first object to provide an improved photovoltaic device with a plurality of serially arranged photovoltaic device cells wherein the risk of a deterioration of the photovoltaic device is at least mitigated.

It is a second object to provide an improved method with which the improved photovoltaic device can be manufactured.

The improved photovoltaic device comprises a stack of layers subsequently including a first electrode layer, a photovoltaic layer, an intermediate layer formed by a charge carrier transport layer, and a second electrode layer. The photovoltaic device has a plurality of mutually subsequent photovoltaic device cells arranged in a first direction.

A substrate for the photo-voltaic device may be glass or be a resin base material. Such resin base materials preferably include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamide-imide (PAI). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc. Dependent on the application a thickness of the substrate may be selected in the range of a relatively small value e.g. 50 micron and a relatively large value, e.g. a few mm or more.

At least one of the electrode layers is a transparent electrode layer. Examples of transparent electrically conductive materials are organic materials such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. The transparent electrically conductive electrode layer may have a thickness in the range of a few tens of nm to a few hundreds of nm, for example in a range between 100 and 200 nm, for example about 120 nm. As the electrical conductivity of a transparent electrode layer is relatively low it may be shunted by electrical conductors, these may be formed as a grid on the transparent electrode layer.

It is not necessary that both electrode layers are transparent. The non-transparent electrode layer can have a relatively large thickness so that no concessions need to be made in regard to the conductivity. A non transparent electrode layer may for example be formed of a layer of suitably conductive material, like aluminum, silver or copper. Also the non-transparent electrode layer, may be provided as a combination of sub layers, e.g. a relative thick main sub layer of an above-mentioned suitably conductive material, e.g. having a thickness of 100 to a few 100 nm or more and a relatively thin interface sub layer at one or both faces of the main sub layer, e.g. a sub layer of a few nm of Mo or Ni Perovskite materials are an important class of materials for use in a photo-voltaic layer, or conversion sub layer, as these materials can be processed at relatively low temperatures, and yet have a conversion efficiency that comes close to that achieved with silicon based photo-voltaic devices. In an embodiment the photo-electric conversion layer is provided of a perovskite material. Perovskite materials typical have a crystal structure of $ABX_3$, wherein A is an organic cation as methylammonium $(CH_3NH_3)+$, B is an inorganic cation, usually lead (II) ($Pb^{2+}$), and X is a halogen atom such as iodine (I—), chlorine (Cl—) or bromine (Br—). Perovskite materials are particularly advantageous in that they can be processed relatively easily and in that their bandgap can be set to a desired value by a proper choice of the halide content. A typical example is methylammonium lead trihalide ($CH_3NH_3PbX_3$), with an optical bandgap between 1.5 and 2.3 eV depending on halide content. Another more complex structure example is Cesium-formamiclinum lead trihalide ($Cs0.05$ ($H_2NCHNH_2$) $0.95PbI2.85Br0.15$) having a bandgap between 1.5 and 2.2 eV. Other metals such as tin may replace the role of Pb in perovskite materials. An example thereof is $CH_3NH_3SnI_3$. Also combinations of Sn with Pb perovskites having a wider bandgap in the range of 1.2 to 2.2 eV are possible. Although perovskite materials are preferred for the reasons specified above, also other materials are suitable, for example copper indium gallium selenide (CIGS).

A noted above, a conversion sub layer may be sandwiched between a hole-transport sub layer and an electron transport sub layer. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Typical examples for this purpose are metal oxides, like nickeloxide, and other compounds, like MoSe. In an embodiment a hole transport sub layer, may have a thickness in the range of 10 to 200 nm. An electron transport sub layer may be formed of a metal oxide, like TiO2, SnO2, ZrO2 and ZnO:S. The electron transport sub layer may have a thickness in the range of a few nm, e.g. 5 nm to a few tens of nm. The photovoltaic layer may for example comprise a first charge carrier transport sub-layer at a side of the conversion sub-layer facing the first electrode layer. The charge carrier transport layer forming the intermediate layer may also be denoted as second charge carrier transport layer to distinguish from this first charge carrier transport sub-layer. As the second charge carrier transport layer is already present as the intermediate layer it is not necessary that the photovoltaic layer comprises a second charge carrier transport sub-layer. Nevertheless one or such sub-layers may be present, also one or more additional first charge carrier transport sub-layers may be comprised in the photovoltaic layer.

It is noted that subsequently including implies that at least these layers are present, and should be present in the specified order. This does not exclude that further layers may be included in the stack, such as a charge carrier transport layer between an electrode layer and the photovoltaic layer, or a barrier layer covering the stack to serve as a barrier to moisture and oxygen. A layer may comprise a plurality of sub-layers. For example an electrode layer may comprise a relatively thick main sub layer of well electrically conductive material, e.g. a layer of copper or aluminum or silver having a thickness of 100 to a few 100 nm or more and a relatively thin interface sub layer at one or both faces of the main sub layer, e.g. a sub layer of a few nm of Mo or Ni.

A pair of a photovoltaic cell and its successor are serially connected in an interface region. The interface region comprises an elongate region that partitions the first electrode layer into first electrode layer portions, a first elongate region that partitions the photovoltaic layer into photovoltaic layer portions, a second elongate region that partitions the second charge carrier transport layer into second charge carrier transport layer portions and a third elongate region that partitions the second electrode layer into second electrode layer portions.

The second elongate region extends within the first elongate region, wherein lateral boundaries of the second elongate region are distinct from those of the first elongate region.

The second elongate region that partitions the second charge carrier transport layer into a first and a second charge carrier transport layer portion at each side of the second elongate region within the first elongate region exposes a contact area of the first electrode layer for the second electrode layer, while the second charge carrier transport layer portions extending within the first elongate region to the second elongate region insulates the material of the photovoltaic layer from that of the second electrode layer.

The charge carrier transport layer serves a dual purpose. In addition to its conventional role it further serves the purpose of protecting the photovoltaic layer at the cell interfaces.

A respective charge carrier transport layer may be present as a first sub-layer between the first electrode layer and a photovoltaic sub-layer and as second sub-layer between the photovoltaic sub-layer and the second electrode layer. Typically metal oxides, for example SnO2, ZnO2 and TiO2 may serve as materials for an electron transport Layer. The material NiO is a typical example for use in a hole transport layer. The charge carrier transport layers may have a thickness in the range of a few tens of nm to about 150 nm, for example in the range of 35 to 100 nm, for example about 70 nm.

In a first example of that embodiment the third elongate region extends within the first elongate region and lateral boundaries of the third elongate region are distinct from those of the first elongate region and those of the second elongate region. An electrical connection between the second electrode layer portion of a photovoltaic cell and a first electrode layer portion of a subsequent photovoltaic cell may be formed in that the second electrode layer portion of the photovoltaic cell extends into the second elongate region onto the exposed portion of the first electrode layer of the subsequent photovoltaic cell.

In a second example the elongate region may extend within the first elongate region and its lateral boundaries may be distinct from those of the first elongate region, the second elongate region and the third elongate region. The elongate region may be provided with a filling of an insulating material and an electrically conductive material may be deposited within the second elongate region so that the electrically conductive material forms a strip extending in the second direction that bridges the filling to electrically contact the second electrode layer.

BRIEF DESCRIPTION OF THE DRAWINGS

These and other aspects are described in more detail with reference to the drawing. Therein:

FIG. 1A is a cross-sectional view according to IA in FIG. 1B and FIG. 1B is a top-view according to IB in FIG. 1A;

FIG. 5A-5H shows subsequent steps of an embodiment of a method to manufacture the first embodiment of the photovoltaic device;

FIG. 6A-6H shows subsequent steps of an embodiment of a method to manufacture the second embodiment of the photovoltaic device;

FIG. 7A-7G shows subsequent steps of an embodiment of a method to manufacture the third embodiment of the photovoltaic device;

FIG. 8 shows an optional subsequent step in any of the above-mentioned embodiments of methods of manufacturing;

FIG. 9A shows another optional step in any of the above-mentioned embodiments of methods of manufacturing;

FIG. 9B shows an exemplary embodiment of a photovoltaic device obtained after completion of the method including the optional step of FIG. 9A.

DETAILED DESCRIPTION OF EMBODIMENTS

Like reference symbols in the various drawings indicate like elements unless otherwise indicated.

Figure 1A:
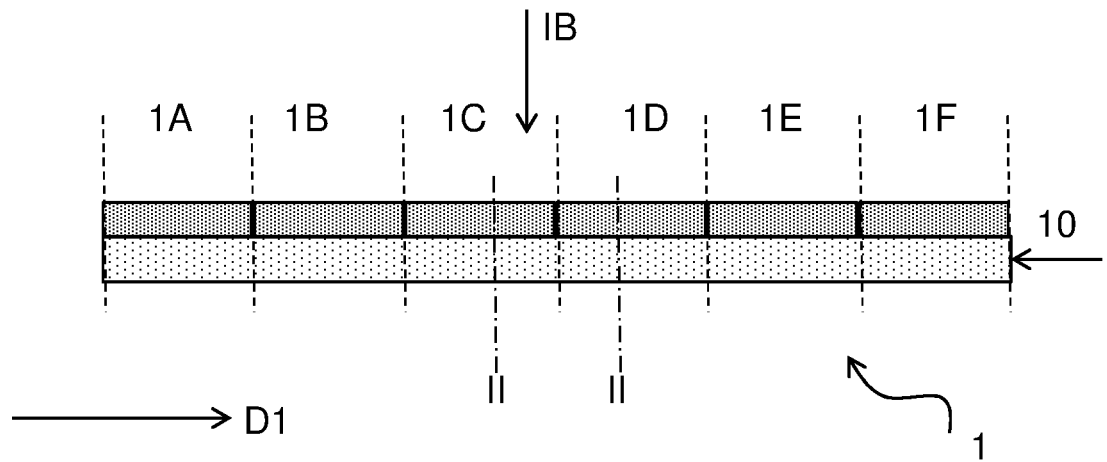
FIGS. 1A and 1B schematically show a photovoltaic device with a plurality of serially connected photovoltaic device cells that are arranged in a first direction on a substrate. Therein
Figure 1B:
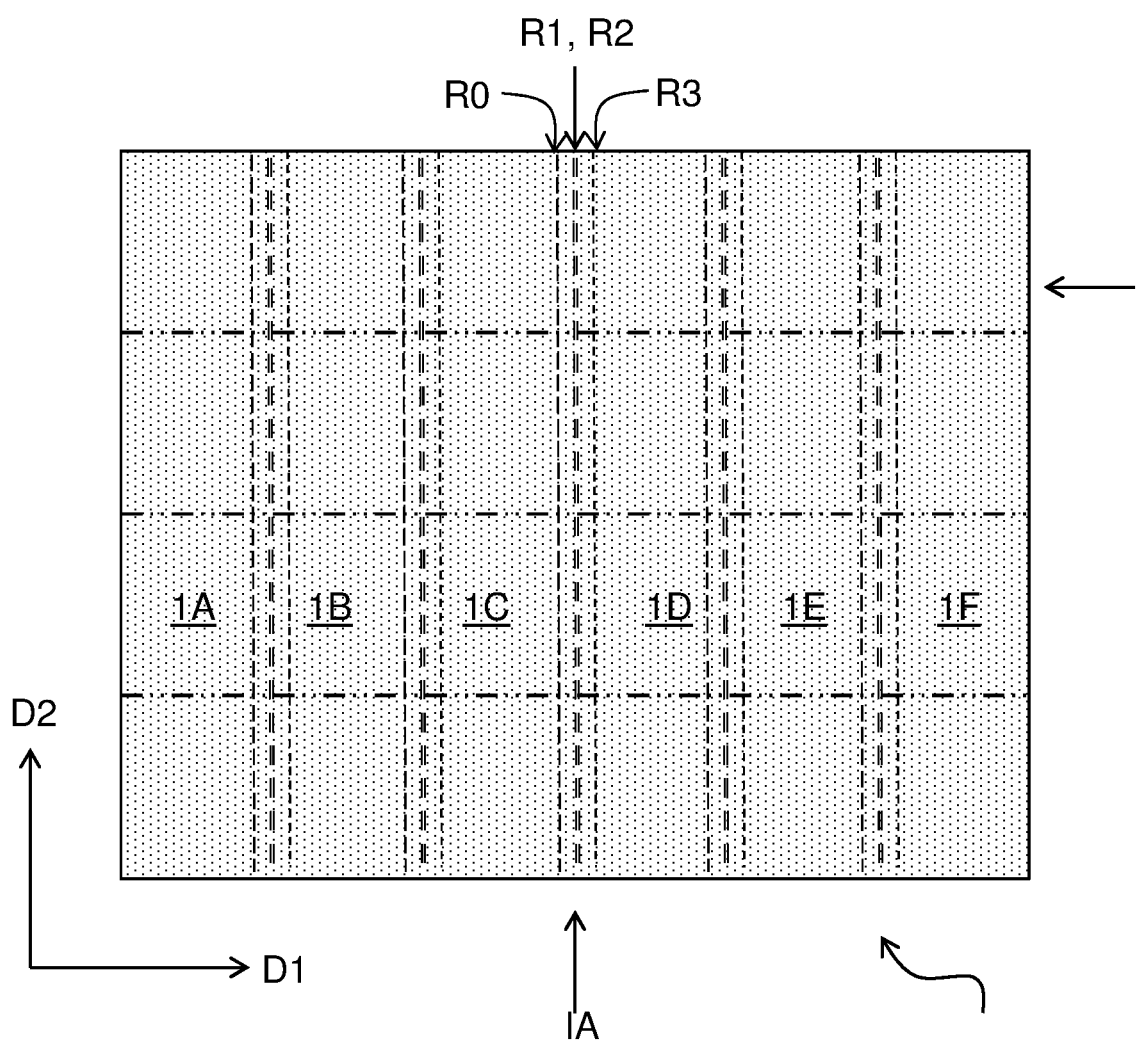

FIGS. 1A and 1B schematically show a photovoltaic device 1 with a plurality of serially connected photovoltaic device cells 1A, . . . , 1F that are arranged in a first direction D1 on a substrate 10. Therein FIG. 1A is a cross-sectional view according to IA in FIG. 1B and FIG. 1B is a top-view according to IB in FIG. 1A. In practice the device 1 may have a smaller or a larger number of photovoltaic device cells than the number 6 as is the case here.

Figure 2:
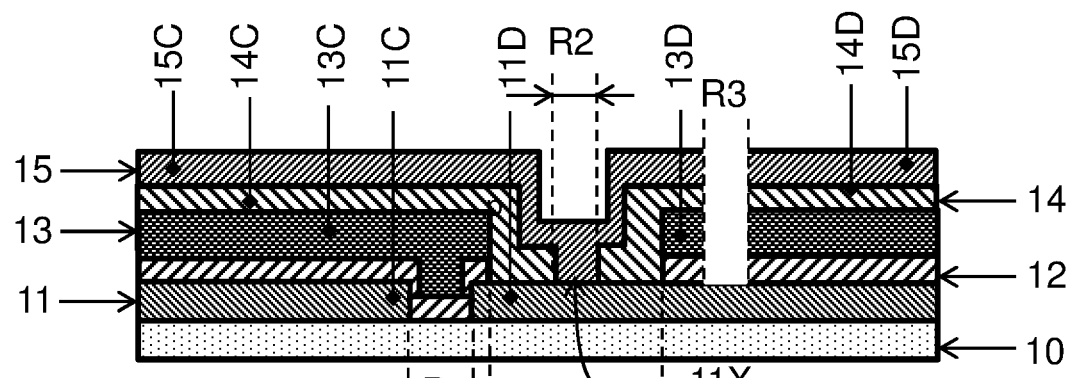
FIG. 2 shows a portion of a cross-section of an interface between subsequent photovoltaic device cells in a first embodiment of the photovoltaic device.
Figure 3:
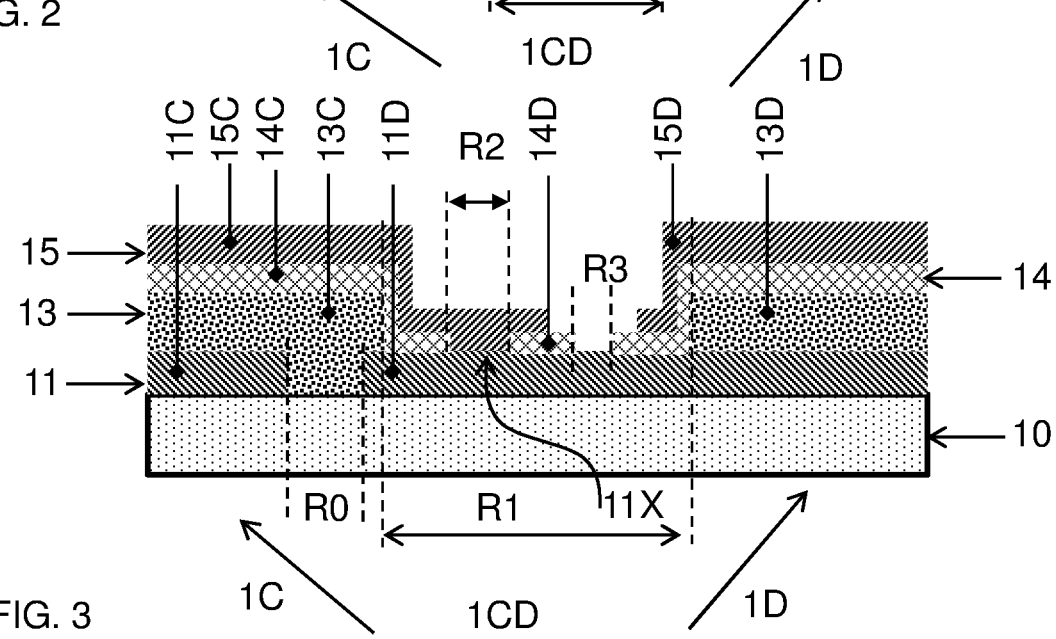
FIG. 3 shows a portion of a cross-section of an interface between subsequent photovoltaic device cells in a second embodiment of the photovoltaic device.
Figure 4:
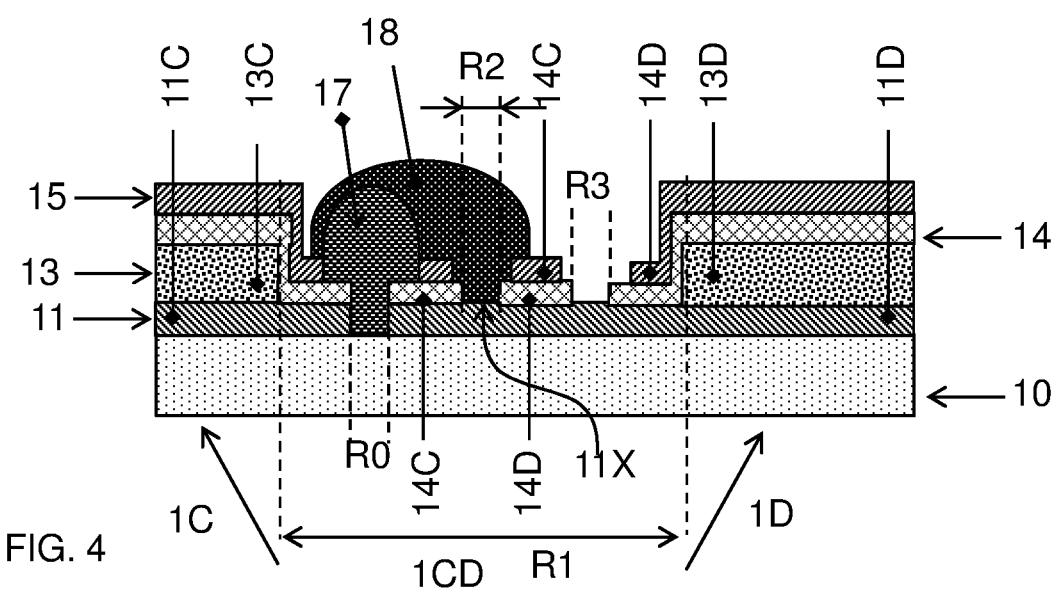
FIG. 4 shows a portion of a cross-section of an interface between subsequent photovoltaic device cells in a third embodiment of the photovoltaic device.

A section A-A of the photovoltaic device 1, comprising the interface 1CD between device cells 1C and 1D is shown in more detail in FIG. 2. In the embodiment shown, other pairs of mutually serially arranged device cells have the same interface. FIG. 3 and FIG. 4 show the interface 1CD in two other embodiments of the photovoltaic device 1. w1).

The photovoltaic device 1 comprises a stack of layers. The stack subsequently includes a first electrode layer 11, a photovoltaic layer 13, an intermediate layer, formed by a charge carrier transport layer 14, and a second electrode layer 15. Pairs of mutually subsequent photovoltaic device cells, for example as shown in detail here for the pair formed by photovoltaic device cells 1C, 1D are serially connected in an interface region 1CD. The interface region 1CD comprises an elongate region R0 that partitions the first electrode layer 11 into first electrode layer portions 11C, 11D one at a side of the photovoltaic device cell 1C and the other at the side of the photovoltaic device cell 1D. Likewise a first elongate region R1 partitions the photovoltaic layer 13 into a photovoltaic layer portions 13C, 13D. A second elongate region R2 partitions the second charge carrier transport layer 14 into second charge carrier transport layer portions 14C, 14D and a third elongate region R3 partitions the second electrode layer 15 into second electrode layer portions 15C, 15D.

The second elongate region R2 extends within the first elongate region R1, such that lateral boundaries of the second elongate region R2 are distinct from those of the first elongate region R1. The second elongate region R2 partitions the intermediate layer, formed by the charge carrier transport layer 14 into a first and a second portion 14C, 14D each a proper side of the second elongate region R2. The second elongate region R2 within the first elongate region further exposes a contact area 11X of the portion 11D of the first electrode layer 11 for the portion 15D of the second electrode layer 15. It can be seen in FIG. 2 that the second charge carrier transport layer portions 14C, 14D extend within the first elongate region R1 toward the second elongate region R2 and therewith insulate the material of the photovoltaic layer 13 from that of the second electrode layer 15.

To protect the R3 area after the full processing an extra isolating and diffusion barrier material can be deposited on top of everything. This will prevent the decomposition of the perovskite materials which are unprotected in the R3 area. Suitable materials (but not limited to these only) with their preferred deposition technology are PECVD SiN, PECVD SiO2 and (spacial) atomic layer deposition Al2O3.

In a first option of the embodiment of FIG. 3, the first and the second electrode layer 11, 15 serve as an anode and a cathode respectively, the first charge carrier transport layer 12 is a hole transport layer and the second charge carrier transport layer 14 is an electron transport layer. In an alternative second option the first and the second electrode layer 11, 15 serve as a cathode and an anode respectively, the first charge carrier transport layer 12 is an electron transport layer and the second charge carrier transport layer 14 is a hole transport layer. At present the first option is preferred as the current technology enables the electron transport layer to be provided with a high quality capable of efficiently shielding photovoltaic layer from the second electrode layer 15.

FIG. 3 shows an alternative embodiment. For clarity, the photovoltaic layer 13 is depicted as a single layer. However, in practice it will comprise a plurality of sub-layers, including at least one conversion sub-layer wherein a conversion of photons into charge pairs takes place and typically also a first charge carrier transport layer at the side of the first electrode layer 11 to facilitate transport of generated charge carriers. Also further sub-layers may be present, like additional charge carrier transport layers.

In the embodiment shown in FIG. 3, the third elongate region R3 extends within the first elongate region R1. Therewith the second charge carrier transport layer 14 forms an intermediate layer that shields the material of the photovoltaic layer portion 13D. Therewith obviating separate steps for shielding this portion. The lateral boundaries of the third elongate region R3 are distinct from those of the first elongate region R1 as well as from those of the second elongate region R2. As shown in FIG. 3, an electrical connection between the second electrode layer portion 15C of the photovoltaic cell 1C and the first electrode layer portion 11D of the subsequent photovoltaic cell 1D is formed in that the second electrode layer portion 15C of the photovoltaic cell 1C extends into the second elongate region R2 onto the exposed portion 11X of the first electrode layer portion 11D of the subsequent photovoltaic cell 1D.

FIG. 4 shows a further embodiment, of the photovoltaic device, wherein also the elongate region R0 extends within the first elongate region R1. Lateral boundaries of the elongate region R0 are distinct from those of the first elongate region R1, those of the second elongate region R2 and those of the third elongate region.

In the embodiment shown in FIG. 4, the elongate region R0 is provided with a filling 17 of an insulating material e.g. acrylic resin and an electrically conductive material e.g. Ag or Cu ink. 18 is deposited within the second elongate region R2 and therewith forms an electrical contact with an exposed portion 11X of the first electrode layer portion 11D of the subsequent photovoltaic cell 1D. The electrically conductive material 18 forms a strip extending in the second direction D2. The strip further bridges the filling 17 to electrically contact the second electrode layer portion 15C of the photovoltaic cell 1C, and therewith forms an electrical connection between the second electrode layer portion 15C and the first electrode layer portion 11D.

FIG. 5A-5H shows subsequent steps of an embodiment of a method to manufacture the embodiment of the photovoltaic device of FIG. 2.

FIG. 5A schematically shows the result of a first and a second step S1, S2. In the first step S1 a first electrode layer 11 is deposited on substrate 10. In a second step the first electrode layer 11 is partitioned into first electrode layer portions 11C, 11D, by removing an elongate region R0 from the first electrode layer 11 that extends in the second direction D2 as shown in FIG. 1B.

It may be contemplated to directly deposit the first electrode layer 11 as a plurality of first electrode layer regions, for example by printing or by a vapor deposition method. Although this is possible this would require that a larger width is reserved for the region R0. Therewith less space would be available outside the interface regions for the photovoltaic cells, which would be at the cost of device efficiency. Consequently this approach is considered less suitable.

FIG. 5B schematically shows a third step S3, wherein a first charge carrier transport layer 12 is deposited. Layer 12 might also be more than one layer e.g. NiO and PTAA.

FIG. 5C shows a fourth step S4, where a photovoltaic material, such as a perovskite is deposited to form a photovoltaic layer 13. The photovoltaic layer might also have some extra layers on top. E.g. C60 or PCBM FIG. 5D shows a fifth step S5, wherein the first charge carrier transport layer 12 is partitioned into the first charge carrier transport layer portions 12C, 12D and the photovoltaic layer 13 is partitioned into photovoltaic layer portions 13C, 13D by removing material thereof within a first elongate region R1 having a width of about 100 μm extending in the direction D2. As an alternative, it may be contemplated to deposit the first charge carrier transport layer 12 and/or the photovoltaic layer 13 directly in the desired pattern for example by printing or by a vapor deposition method. In practice this approach was considered less suitable for the reasons specified above.

FIG. 5E shows a sixth step S6 wherein a second charge carrier transport layer 14 is deposited.

FIG. 5F shows a seventh step S1. Therein the second charge carrier transport layer 14, that was deposited in step SG, is partitioned into second charge carrier transport layer portions 14C, 14D by removing material from this layer 14 within a second elongate region R2 having a width of about 40 μm that extends within the first elongate region R1. The lateral boundaries R2c, R2d of the second elongate region R2 are distinct from those R1c, R1d of the first elongate region R1. As a result of removing the material of the second charge carrier transport layer 14 within the second elongate region R2, the first electrode layer portion 11D is exposed in that region R2, indicated as exposed first electrode layer portion 11X.

As an alternative, it may be contemplated to directly deposit the second charge carrier transport layer 14 in a pattern with second charge carrier transport layer portions 14C, 14D shown in FIG. 5F. In practice this appears to be less feasible as set out above.

FIG. 5G shows an eighth step S8, wherein a second electrode layer 15 is deposited. The second relatively narrow elongate region R2 wherein the second charge carrier transport layer 14 is interrupted exposes a contact area 11X where the second electrode layer 15 forms an electric contact with first electrode layer portion 11D associated with the second photovoltaic cell 1D to be formed. At both sides R2c, R2d of the relatively narrow elongate region R2 a portion of the second charge carrier transport layer 14 remains within the first, relatively wide elongate region R1. The second charge carrier transport layer portion 14C extends beyond the lateral side R1c of elongate region R1 towards the lateral side R2c of the elongate region R2. The second charge carrier transport layer portion 14D extends beyond the lateral side R1d of elongate region R1 towards the lateral side R2d of the elongate region R2. These extensions of the second charge carrier transport layer portions 14C, 14D insulates the material of the photovoltaic layer portion 13C, 13D from that the second electrode layer 12.

FIG. 5H shows a ninth step S9. Therein the second electrode layer 15 is partitioned into second electrode layer portions 15C, 15D. Also an end of the first charge carrier transport layer portion 12D, of the photovoltaic layer portion 13, and of the second charge carrier transport layer 14D is separated. Therewith it is achieved that the photovoltaic cells 1C, 1D are serially connected by the electrical contact between the second electrode layer portion 15C with the first electrode layer portion 11D at location 11X. Any leakage currents are avoided by the separation with region R3 at the ends of the first charge carrier transport layer portion 12D, of the photovoltaic layer portion 13D, and of the second charge carrier transport layer 14D. Also in this context it may be contemplated to avoid the partitioning step S9 by instead directly depositing the layers 11-15 with this partition. For the reasons set out above, this is a less attractive option. Subsequent to step S9, further steps may be performed, for example to apply one or more of a protection or barrier layers, to provide electric contacts, to test the device etc. For example, as shown in FIG. 8, a barrier layer 20 may be deposited, for example a layer of silicon oxide or silicon nitride, for example deposited with a vapor deposition process, e.g. PVD, CVD or PCVD. Also Al2O3 or other isolating oxides deposited e.g. with (Spatial) Atomic Layer deposition are possible candidates for this layer 20. If desired, the barrier layer 20 may comprise a stack of sub-layers for in particular sub-layers of silicon oxide and silicon nitride that alternate each other. Although the barrier layer 20 is particularly intended to protect the exposed side walls of the photovoltaic layer 13, the barrier layer 20 is typically deposited in a uniform manner as a deposition restricted to these side walls would be more complicated and have no additional value above a uniform deposition. If desired such a barrier layer may also be applied to the devices of FIGS. 3 and 4, although in these embodiments the side walls of the photovoltaic layer 13 are already protected by the material of the second charge carrier transport layer 14.

FIG. 6A-6H shows subsequent steps of an embodiment of a method to manufacture the second embodiment of the photovoltaic device as shown in FIG. 3.

The method may start, See FIG. 6A, with steps S11, S12, that correspond to steps S1, S2 as described with reference to FIG. 5A.

FIG. 6B shows the deposition of a photovoltaic layer 13 in step S13. The photovoltaic layer 13 may represents a stack of sub-layers, comprising a first charge carrier transport sub-layer, a conversion sub-layer to convert photons into charge pairs and a second charge carrier transport sub-layer. Also smaller or larger plurality of sub-layers may be present. For clarity however, a single layer 13 is shown.

FIG. 6C shows partitioning of the photovoltaic layer 13 in step S14 into photovoltaic layer portions 13C and 13D, at both sides of a first elongate region R1 extending in the direction D2 (See FIG. 1B). Also photovoltaic layer ribs 13P, 13Q are formed that extend in the direction D2, by partitioning with three elongate sub-regions Rx, Ry, Rz. A suitably tuned laser L may be used for this purpose. Good results were obtained with a laser having a wavelength of 532 nm. Also a wavelength of 355 nm proved to be suitable. Preferably the laser L is pulsed with a pulse length in the order of picoseconds or short so as to keep heat development localized to these sub-ranges Rx, Ry, Rz.

FIG. 6D shows a step S15, wherein a charge carrier transport layer 14 is deposited.

FIG. 6E shows step S16. Therein photovoltaic layer rib 13P is exposed to irradiation from a laser L. Therewith the material of the rib and the surrounding material of the second charge carrier transport layer 14 is removed, resulting in a partitioning of the charge carrier transport layer 14 into charge carrier transport layer portions 14C, 14D and an exposure of 11X of the first electrode layer portion 11D within the second region R2. (See FIG. 6F)

FIG. 6G shows subsequent steps S17, S18. In step S17, a second electrode layer 15 is deposited. The second electrode layer 15 forms an electric contact with the first electrode layer portion 11D in the exposed region 11X thereof, but does not come into contact with the photovoltaic layer 13, due to the presence of the charge carrier transport layer 14.

In step S18, also illustrated in FIG. 6G, photovoltaic layer rib 13Q is exposed to irradiation from a laser L. The wavelength is selected in range that is transmitted by the second electrode layer 15 and the charge carrier transport layer 14, and well absorbed by the photovoltaic layer rib 13Q. As a result of the absorption of the radiation in the rib 13Q, the material evaporates and the pressure developed therewith causes a removal of the portions 15a, 14a of the second electrode layer 15 and the charge carrier transport layer 14 immediately surrounding the rib, as shown in FIG. 6H. The removal of material from the second electrode layer 15 in the third elongate region R3 partitions that layer into second electrode layer portions 15C, 15D. Also the charge carrier transport layer 14 is partitioned therewith. Therewith it is achieved that the photovoltaic cells 1C, 1D are serially connected by the electrical contact between the second electrode layer portion 15C with the first electrode layer portion 11D at location 11X.

FIG. 9A illustrates an optional step S1415. In this step S1415, which is optionally performed subsequent to step S14 and before step S15, insulating layer portions 19x, 19y, 19z of an insulating material are selectively grown within the regions Rx, Ry, Rz, while leaving free the surface formed by the perovskite photovoltaic layer.

FIG. 9B shows the product that is obtained if subsequently the steps S15 to S18 are performed, as described above. As is apparent from FIG. 9B, the insulating layer portion 19z may avoid that a leakage current occurs in the region Rz between the first electrode layer portion 11D and the second electrode layer portion 15D, even if the material of the second charge carrier transport layer 14 has a relatively high conductivity. As a result of step S1415, also insulating layer portions 19x, 19y are formed within the regions Rx, Ry. These portions 19x, 19y are without function, but also have no negative implications, and therewith can remain.

One option to deposit the insulating layer portions is the use of selective (spatial) Atomic Layer Deposition (ALD) of Al2O3. It has been shown suitable to grow a layer of at least a 3 nm layer on anything but the perovskite photovoltaic layer. If a thicker layer is required then this process can be combined with Atomic Layer Etching (ALE) which removes a few atomic layers and thereby enables a further selective growth. By repeating the ALD and ALE a thick isolating layer can be grown.

FIG. 7A-7G shows subsequent steps of an embodiment of a method to manufacture the third embodiment of the photovoltaic device, shown in FIG. 4.

A first electrode layer 11 and a photovoltaic layer 13, typically a stack of sub-layers are deposited in steps S21, S22 as shown in FIG. 7A.

FIG. 7B shows a partitioning of a the photovoltaic layer (stack) 13 into photovoltaic layer portions 13C, 13D at respective sides of the first elongate region elongate R1. Ribs 13P, 13Q, 13R, are formed from the photovoltaic layer 13, in that material of the photovoltaic layer 13 is removed in elongate sub-regions Rw, Rx, Ry, Rz. This may be achieved by mechanical means, but preferably by ablation with a laser.

FIG. 7C shows the steps S24, S25, S26. In steps S24, S25 a uniform deposition of a second charge carrier transport layer 14 and a second electrode layer 15 takes place. In step S26 the rib 13P is exposed to irradiation. As a result it is ablated causing also the removal of immediately surrounding material from the first electrode layer 11, the second charge carrier transport layer 14 and the second electrode layer 15. As a result, shown in FIG. 7D, the first electrode layer 11 is partitioned into first electrode layer portions 11C, 11D, each at a side of the elongate region R0 where the material of the rib 13P was removed. Also the second electrode layer 15 is partitioned into second electrode layer portions 15C, 15D. The second charge carrier transport layer 14 is partitioned as well.

FIG. 7E shows steps S27 and S28. In step S27 the space in the elongate region R0 is filled with an insulating material 17 e.g. acrylic resin. In step S28, the rib 13Q and the immediately surrounding material of the layers 14, 17 is removed. As a result portion 11D of the first electrode layer 11 is exposed and this is electrically connected to portion 15C of the second electrode layer 15 by depositing an electrically conductive material 18 in as a strip that extends in the second direction D2, see FIG. 1B. The electrically conductive material 18 that bridges the filling 17 to electrically contact the second electrode layer portion 15C at one side and protrudes in the elongate opening in region R2 to electrically contact first electrode layer portion 11D.

To disconnect the second electrode layer portion 15D from the contact formed by the electrically conductive material the rib 13R and immediately surrounding material of the layers 14, 17 is ablated. Therewith a proper serial connection is obtained via the second electrode layer portion 15C, the electrically conductive material 18 e.g. silver or copper ink, and the electric contact thereof with the first electrode layer portion 11D in 11X as shown in FIG. 7G.

Also in this embodiment, in case the material used for the second charge carrier transport layer 14 has a relatively high conductivity, insulating layer portions may be deposited, in an optional intermediate step S1415, to be performed subsequent to step S23 (FIG. 7B) and step S24 (FIG. 7C).

The invention claimed is:

1. A photovoltaic device comprising a plurality of layers including a first electrode layer, a photovoltaic layer, a charge carrier transport layer forming an intermediate layer, and a second electrode layer; the photovoltaic device having a plurality of serially connected photovoltaic device cells arranged in a first direction, each pair of a photovoltaic cell and a subsequent photovoltaic cell, of the plurality of serially connected photovoltaic device cells, being serially connected in an interface region, wherein the interface region comprises:
an elongate region that partitions the first electrode layer into first electrode layer portions,
a first elongate region that partitions the photovoltaic layer into respective photovoltaic layer portions at respective first lateral boundaries of the first elongate region, wherein each of the respective first lateral boundaries are distinct from each other in the first direction,
a second elongate region that partitions the intermediate layer into respective intermediate layer portions at respective second lateral boundaries of the second elongate region, wherein respective second lateral boundaries are distinct from each other in the first direction, and
a third elongate region that partitions the second electrode layer into second electrode layer portions;
wherein the second elongate region extends within the first elongate region,
wherein each of the respective second lateral boundaries is distinct from each of the respective first lateral boundaries,
wherein the third elongate region extends within the first elongate region, and wherein lateral boundaries of the third elongate region are distinct from those of the first elongate region and those of the second elongate region, wherein the elongate region extends within the first elongate region, and wherein lateral boundaries of the elongate region are distinct from the lateral boundaries of:
the first elongate region,
the second elongate region, and
the third elongate region.

2. The photovoltaic device according to claim 1, further comprising an insulating layer portion on a second portion of the first electrode layer in an elongate region that extends between the third elongate region and a boundary of a second portion of the photovoltaic layer.

3. The photovoltaic device according to claim 1, wherein an electrical connection between the second electrode layer portion of a photovoltaic cell and a first electrode layer portion of a subsequent photovoltaic cell is formed by the second electrode layer portion of the photovoltaic cell extending into the second elongate region and onto the exposed portion of the first electrode layer portion of the subsequent photovoltaic cell.

4. The photovoltaic device according to claim 1, wherein the elongate region is provided with a filling of an insulating material, wherein an electrically conductive material is deposited within the second elongate region, and wherein the electrically conductive material forms a strip extending in the second direction that bridges the filling to electrically contact the second electrode layer.

5. The photovoltaic device according to claim 1, wherein the stack of layers further includes a layer of an isolation material provided subsequent to the second electrode layer, wherein the layer of an isolation material forms a cladding inside the third elongate region.

6. The photovoltaic device according to claim 4, further comprising an insulating layer portion on a second portion of the first electrode layer in an elongate region that extends between the third elongate region and a boundary of a second portion of the photovoltaic layer.

7. The photovoltaic device according to claim 4, wherein an electrical connection between the second electrode layer portion of a photovoltaic cell and a first electrode layer portion of a subsequent photovoltaic cell is formed by the second electrode layer portion of the photovoltaic cell extending into the second elongate region and onto the exposed portion of the first electrode layer portion of the subsequent photovoltaic cell.

8. The photovoltaic device according to claim 4, wherein the stack of layers further includes a layer of an isolation material provided subsequent to the second electrode layer, wherein the layer of an isolation material forms a cladding inside the third elongate region.

* * * * *